US011483019B2

(12) United States Patent
Tsuda et al.

(10) Patent No.: US 11,483,019 B2
(45) Date of Patent: Oct. 25, 2022

(54) RADIO-FREQUENCY MODULE AND COMMUNICATION DEVICE

(71) Applicant: Murata Manufacturing Co., Ltd., Kyoto (JP)

(72) Inventors: Motoji Tsuda, Kyoto (JP); Yukiya Yamaguchi, Kyoto (JP); Sho Matsumoto, Kyoto (JP); Hiroyuki Kani, Kyoto (JP); Atsushi Horita, Kyoto (JP); Morio Takeuchi, Kyoto (JP); Yusuke Naniwa, Kyoto (JP); Jin Yokoyama, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/351,867

(22) Filed: Jun. 18, 2021

(65) Prior Publication Data

US 2021/0314010 A1 Oct. 7, 2021

Related U.S. Application Data

(63) Continuation of application No. PCT/JP2019/043539, filed on Nov. 6, 2019.

(30) Foreign Application Priority Data

Dec. 21, 2018 (JP) .............................. JP2018-240086

(51) Int. Cl.
*H04B 1/04* (2006.01)
*H04B 1/00* (2006.01)
(Continued)

(52) U.S. Cl.
CPC ........... *H04B 1/0483* (2013.01); *H04B 1/006* (2013.01); *H04B 1/1018* (2013.01); *H04B 1/50* (2013.01)

(58) Field of Classification Search
CPC .... H04B 1/0483; H04B 1/006; H04B 1/1018; H04B 1/50; H04B 1/48; H03H 7/46
See application file for complete search history.

(56) References Cited

U.S. PATENT DOCUMENTS 5,276,914 A * 1/1994 Ishizuka .................. H04B 1/52
375/216
5,915,212 A * 6/1999 Przelomiec ........... H04W 16/02
455/552.1

(Continued)

FOREIGN PATENT DOCUMENTS

CN 1234148 A 11/1999
JP 2018-137522 A 8/2018
(Continued)

OTHER PUBLICATIONS

International Search Report for International Patent Application No. PCT/JP2019/043539 dated Jan. 7, 2020.
(Continued)

*Primary Examiner* — Jinsong Hu
*Assistant Examiner* — Rui M Hu
(74) *Attorney, Agent, or Firm* — Pearne & Gordon LLP

(57) ABSTRACT

A radio-frequency module includes a switch performing switching of the connection between a common terminal and a selection terminal, a reception filter having a reception band in a band A as a passband, a transmission filter that has a transmission band in a band B as a passband and has an output terminal connected to the selection terminal, a filter that has the transmission band in a band B as an attenuation band and has an input terminal connected to the selection terminal, a reception path which connects the selection terminal and an input terminal of the reception filter and on which the filter is disposed, a bypass path which connects the selection terminal and the input terminal of the reception filter and on which no filter is disposed, and a transmission (Continued)

path which connects the selection terminal and a transmission terminal and on which the transmission filter is disposed.

20 Claims, 8 Drawing Sheets

(51) Int. Cl.
*H04B 1/10* (2006.01)
*H04B 1/50* (2006.01)

(56) References Cited

U.S. PATENT DOCUMENTS

| | | | | |
|---|---|---|---|---|
| 8,036,148 | B2* | 10/2011 | Fukamachi | H04B 1/44 |
| | | | | 370/282 |
| 9,118,302 | B2* | 8/2015 | Shimizu | H03H 7/461 |
| 2002/0085509 | A1* | 7/2002 | Funayama | H04B 1/525 |
| | | | | 370/276 |
| 2007/0042802 | A1 | 2/2007 | Park et al. | |
| 2007/0155344 | A1* | 7/2007 | Wiessner | H04B 1/006 |
| | | | | 455/78 |
| 2014/0321339 | A1* | 10/2014 | Pehlke | H04L 5/14 |
| | | | | 370/281 |
| 2015/0304000 | A1* | 10/2015 | Wloczysiak | H04B 1/44 |
| | | | | 455/78 |
| 2016/0020737 | A1* | 1/2016 | Kong | H01Q 21/28 |
| | | | | 330/250 |
| 2016/0050665 | A1* | 2/2016 | Chang | H04L 5/001 |
| | | | | 370/280 |
| 2017/0222665 | A1* | 8/2017 | Chang | H04B 1/48 |
| 2017/0294947 | A1* | 10/2017 | Little | H04B 1/006 |
| 2017/0353287 | A1 | 12/2017 | Onaka et al. | |
| 2018/0019768 | A1 | 1/2018 | King et al. | |
| 2018/0138927 | A1 | 5/2018 | Nagumo et al. | |
| 2018/0152945 | A1* | 5/2018 | Balteanu | H03F 3/72 |
| 2019/0007073 | A1* | 1/2019 | King | H04B 1/0057 |
| 2019/0115947 | A1 | 4/2019 | Nosaka | |
| 2019/0181907 | A1* | 6/2019 | Pfann | H04B 1/525 |
| 2021/0067186 | A1* | 3/2021 | Beaudin | H04B 1/401 |
| 2021/0084648 | A1* | 3/2021 | Gilmore | H04W 40/244 |

FOREIGN PATENT DOCUMENTS

| | | |
|---|---|---|
| WO | 2016/129401 A1 | 8/2016 |
| WO | 2017/013910 A1 | 1/2017 |
| WO | 2017/199649 A1 | 11/2017 |

OTHER PUBLICATIONS

Written Opinion for International Patent Application No. PCT/JP2019/043539 dated Jan. 7, 2020.

* cited by examiner

RADIO-FREQUENCY MODULE AND COMMUNICATION DEVICE

CROSS REFERENCE TO RELATED APPLICATIONS

This is a continuation of International Application No. PCT/JP2019/043539 filed on Nov. 6, 2019 which claims priority from Japanese Patent Application No. 2018-240086 filed on Dec. 21, 2018. The contents of these applications are incorporated herein by reference in their entireties.

BACKGROUND OF THE DISCLOSURE

Field of the Disclosure

The present disclosure relates to a radio-frequency module that processes radio-frequency signals and a communication device.

Description of the Related Art

Recent radio-frequency modules are required to employ a system in which a transmission signal and a reception signal in different frequency bands are simultaneously transmitted and received.

Patent Document 1 discloses the circuit configuration of a radio-frequency module in which one or more transmission filters and one or more reception filters are connected in common via a diplexer and a switch. With this configuration, the transmission of a single transmission signal and the reception of a single reception signal can be simultaneously performed.

Patent Document 1: Japanese Unexamined Patent Application Publication No. 2018-137522

BRIEF SUMMARY OF THE DISCLOSURE

In the radio-frequency module disclosed in Patent Document 1, however, the sensitivity of a reception signal may degrade depending on the combination of a transmission signal and a reception signal transmitted and received at the same time. For example, when a band in which the attenuation characteristics of a reception filter are insufficient and the frequency band of a transmission signal overlap, the transmission signal having a high signal strength leaks into an RF signal processing circuit subsequent to the reception filter and degrades reception sensitivity.

The present disclosure has been made to solve the above problem, and it is an object of the present disclosure to provide a radio-frequency module and a communication device with which the degradation of reception sensitivity is suppressed in a system capable of simultaneously performing the transmission of a transmission signal and the reception of a reception signal.

To accomplish the above object, a radio-frequency module according to an aspect of the present disclosure includes a transmission/reception terminal, a first reception terminal, a first transmission terminal, a first switch that has a first common terminal connected to the transmission/reception terminal, a first selection terminal, and a second selection terminal and performs switching between a state in which the first common terminal and the first selection terminal are connected and a state in which the first common terminal and the second selection terminal are connected, a first reception filter that has a reception band belonging to a first frequency band as a passband and has an output terminal connected to the first reception terminal, a second transmission filter that has a transmission band belonging to a second frequency band as a passband and has an input terminal connected to the first transmission terminal and an output terminal connected to the second selection terminal, a third filter that has the transmission band as an attenuation band and is connected between the second selection terminal and the first reception filter, a first reception path which connects the second selection terminal and an input terminal of the first reception filter and on which the third filter is disposed, a first bypass path which connects the first selection terminal and the input terminal of the first reception filter and on which no filter is disposed, and a second transmission path which connects the second selection terminal and the first transmission terminal and on which the second transmission filter is disposed.

According to the present disclosure, there can be provided a radio-frequency module and a communication device with which the degradation of reception sensitivity is suppressed in a system capable of simultaneously performing the transmission of a transmission signal and the reception of a reception signal.

Figure 2A:
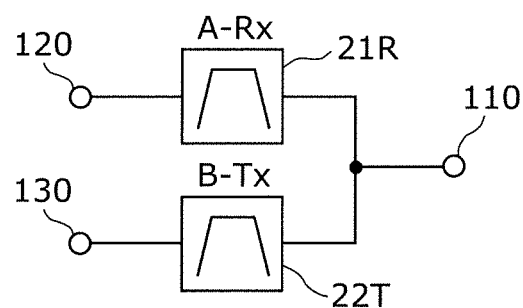
Figure 2B:
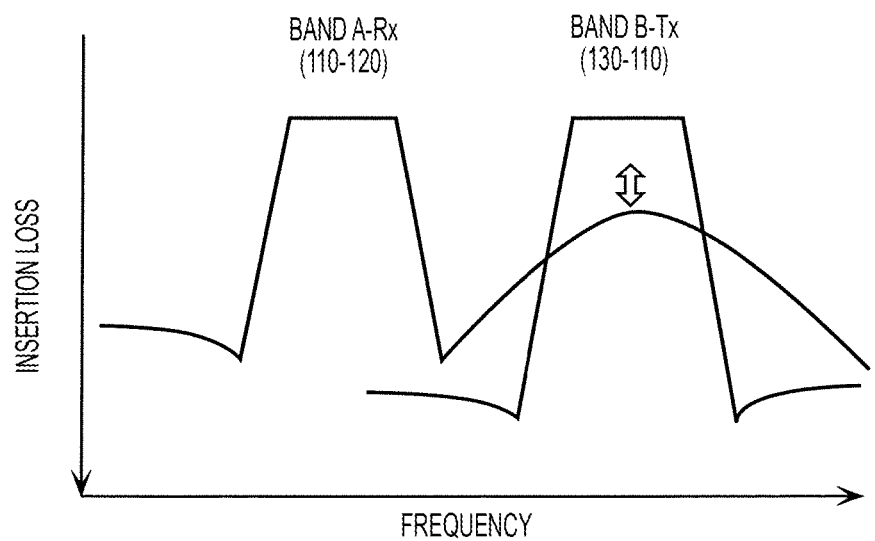

Each of FIGS. 2A and 2B is a diagram describing a factor in the degradation of reception sensitivity of a multiplexer in which a transmission filter and a reception filter are connected in common.

Figure 3A:
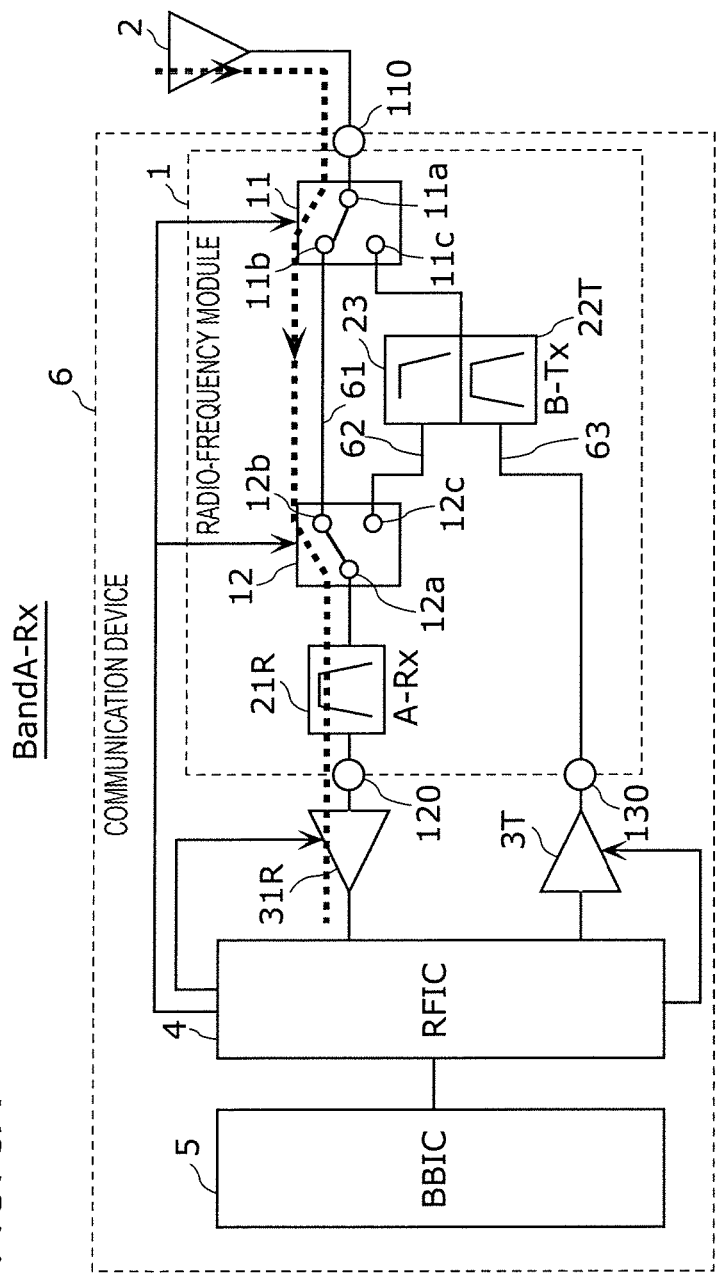

FIG. 3A is a diagram illustrating a circuit state when a reception signal in a band A is transmitted in a radio-frequency module and a communication device according to the first embodiment.

Figure 3B:
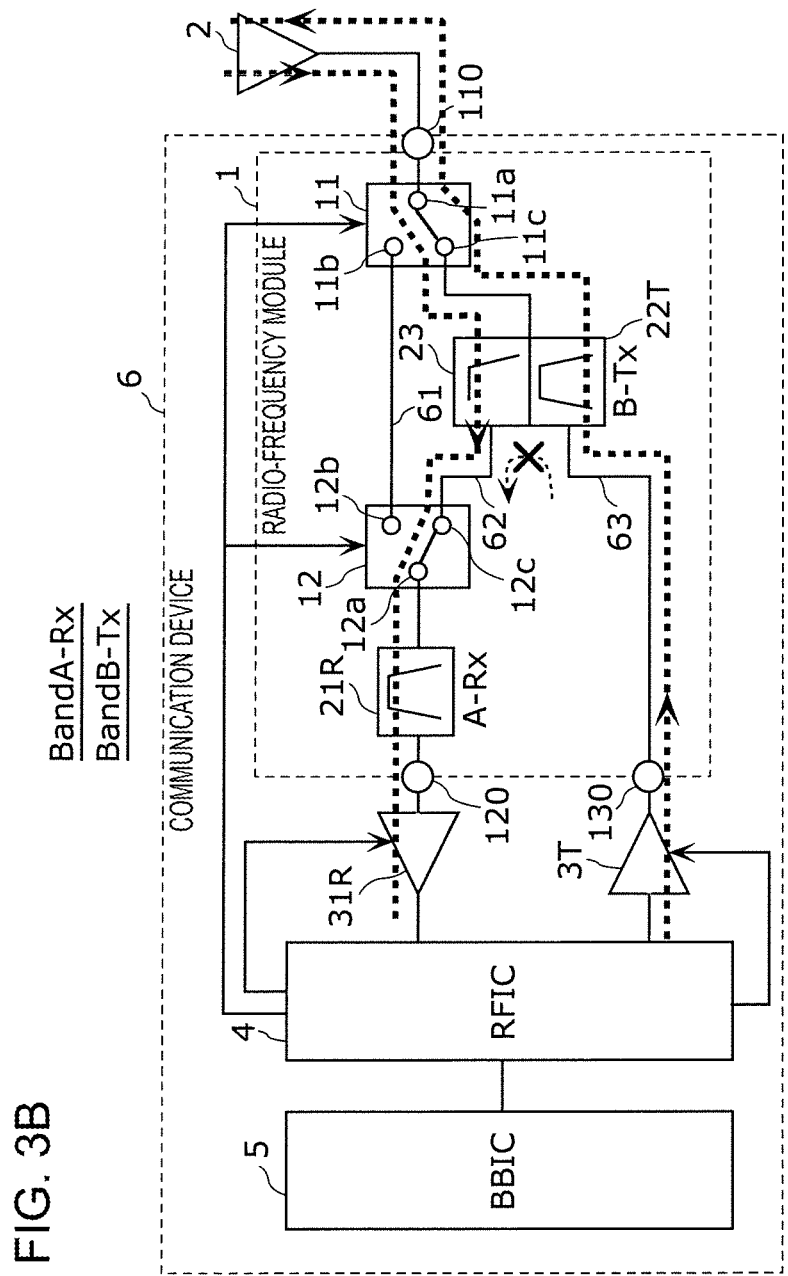

FIG. 3B is a diagram illustrating a circuit state when a reception signal in the band A and a transmission signal in a band B are simultaneously transmitted in a radio-frequency module and a communication device according to the first embodiment.

Figure 4:
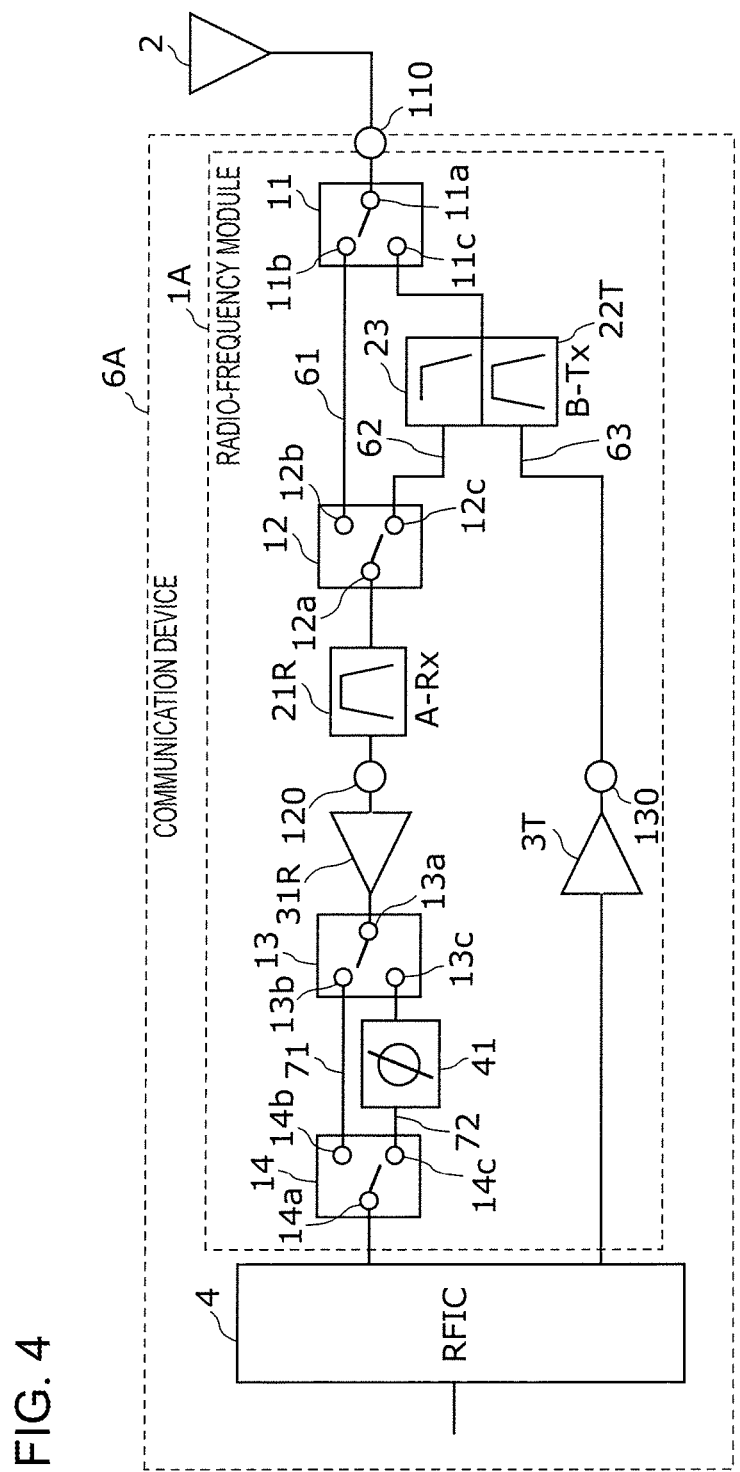

FIG. 4 is a diagram illustrating the circuit configuration of a radio-frequency module and a communication device according to a modification of the first embodiment.

Figure 5:
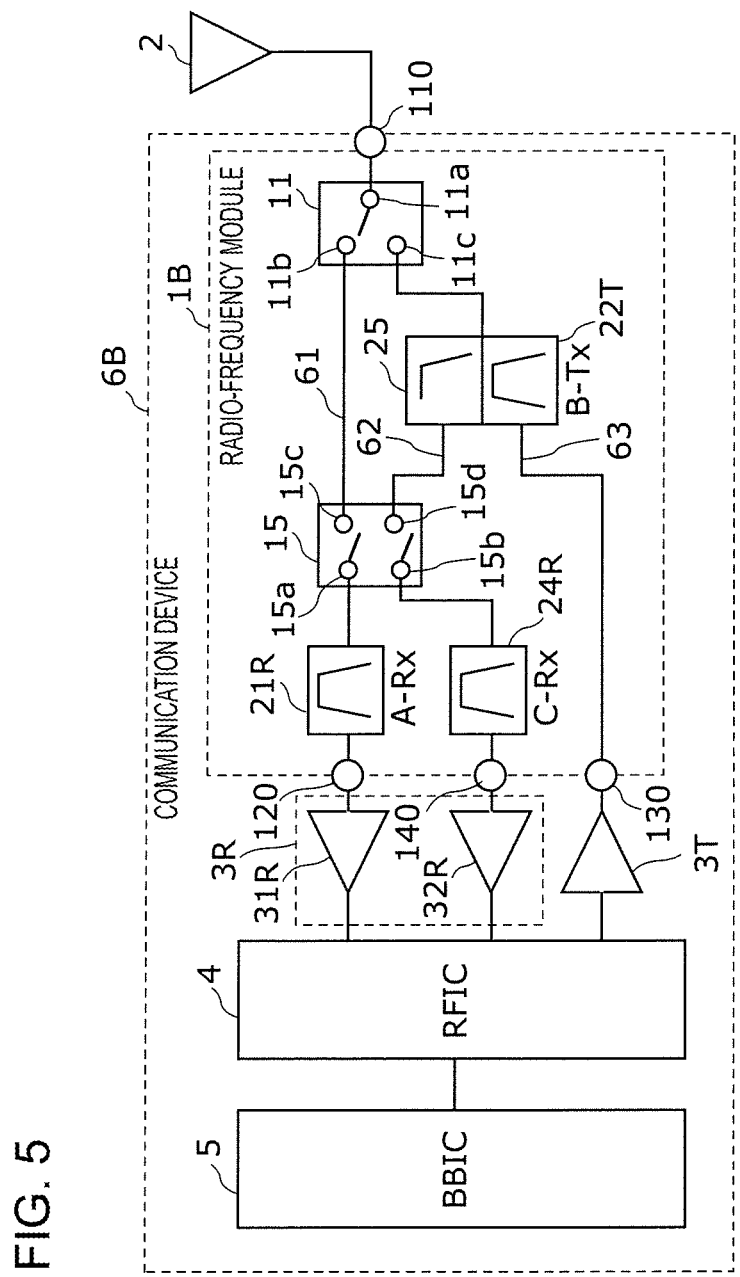

FIG. 5 is a diagram illustrating the circuit configuration of a radio-frequency module and a communication device according to a second embodiment.

Figure 6A:
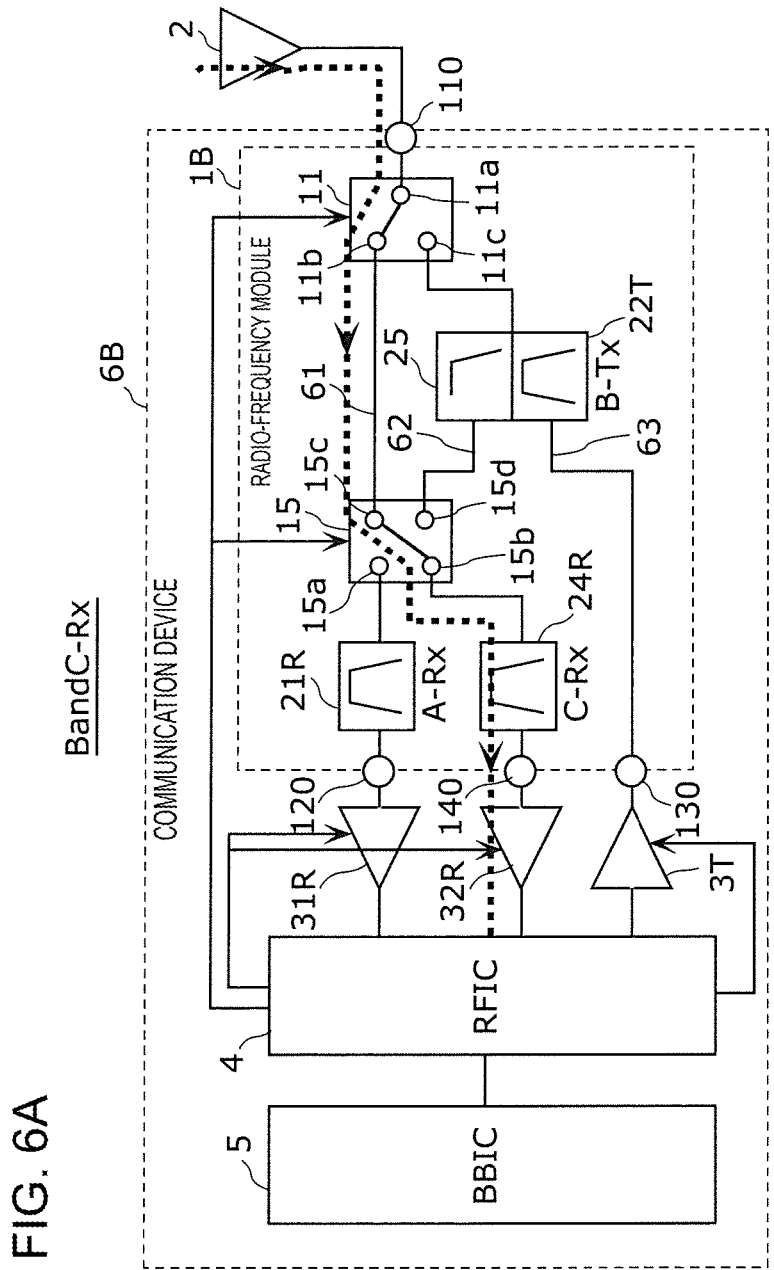

FIG. 6A is a diagram illustrating a circuit state when a reception signal in a band C is transmitted in a radio-frequency module and a communication device according to the second embodiment.

Figure 6B:
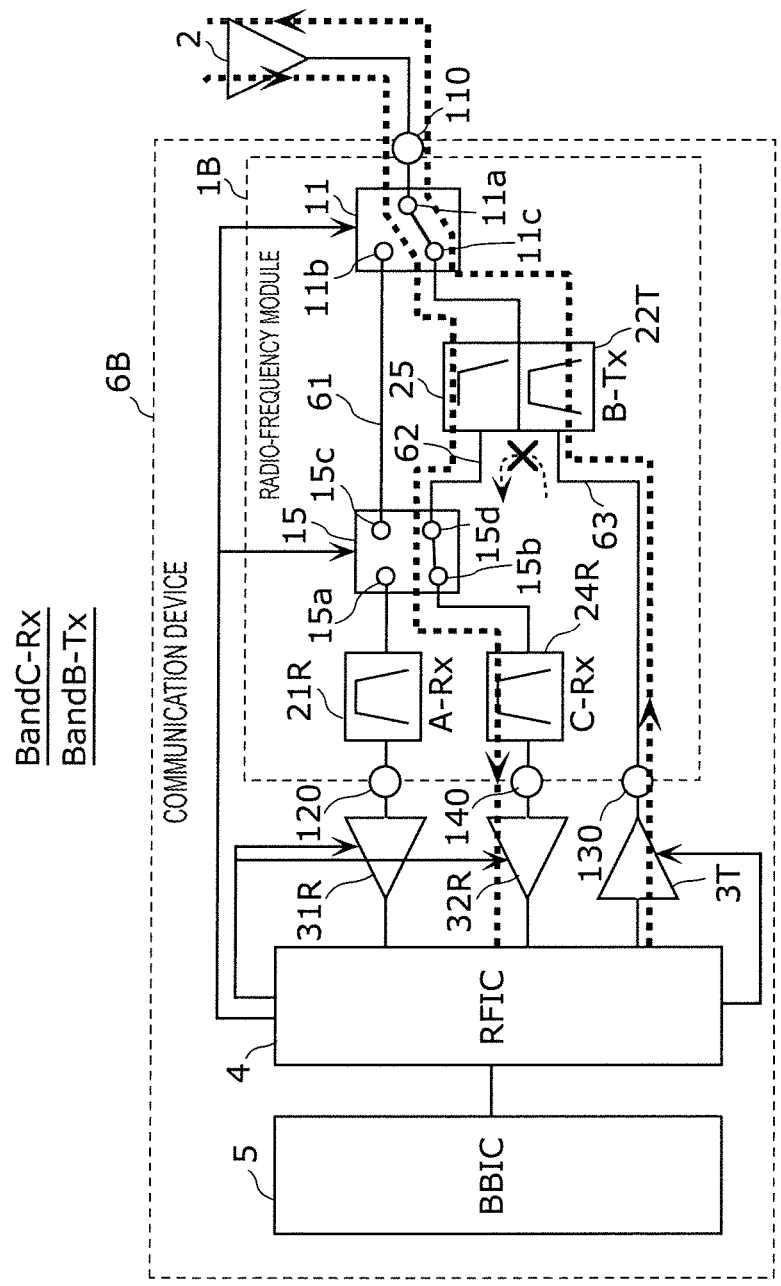

FIG. 6B is a diagram illustrating a circuit state when a reception signal in the band C and a transmission signal in the band B are simultaneously transmitted in a radio-frequency module and a communication device according to the second embodiment.

DETAILED DESCRIPTION OF THE DISCLOSURE

Embodiments of the present disclosure will be described in detail below with reference to the drawings. The embodiments to be described below represent a comprehensive or concrete example. The numerical values, shapes, materials, constituent elements, the arrangement and connection state of the constituent elements to be described in the following embodiments are merely illustrative examples, and are not intended to limit the present disclosure. Among the constituent elements included in the following embodiments, those not recited in the independent claim of the present disclosure are described as optional constituent elements. The sizes or the ratio of sizes of the constituent elements illustrated in the drawings are not necessarily precise.

First Embodiment

[1.1 Configuration of Radio-Frequency Module 1 and Communication Device 6]

Figure 1:
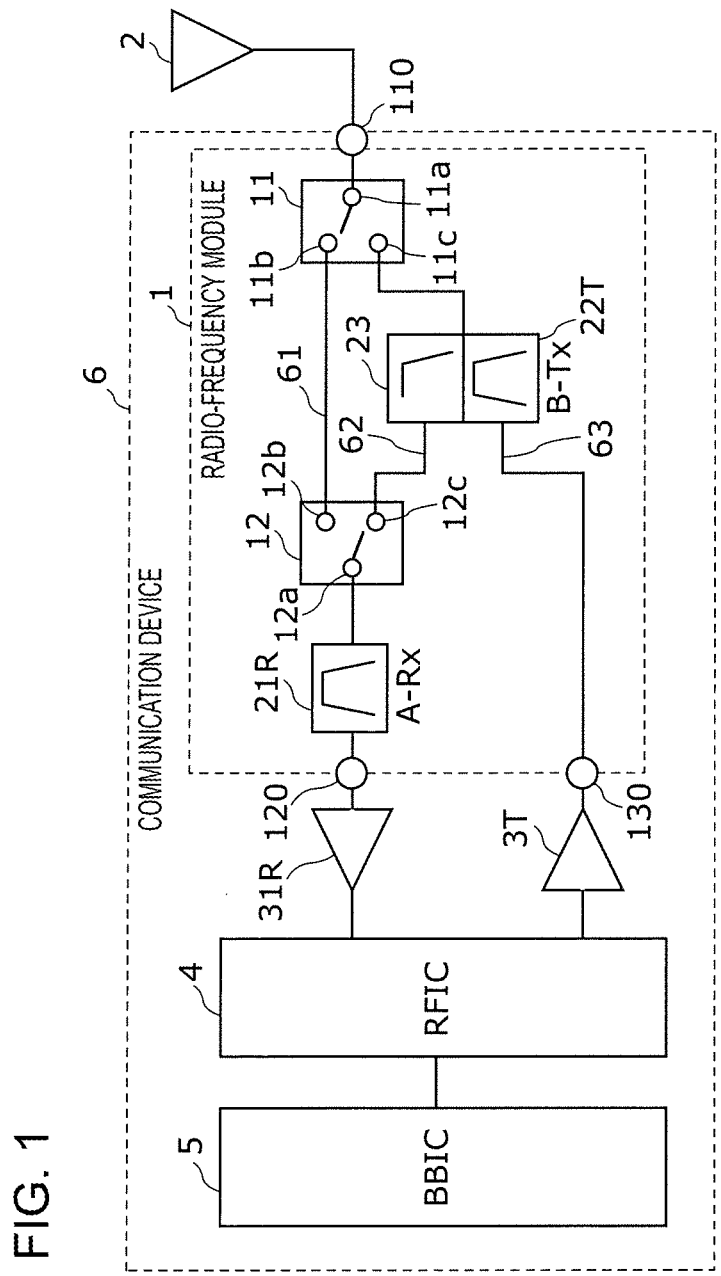
FIG. 1 is a diagram illustrating the circuit configuration of a radio-frequency module and a communication device according to a first embodiment.

FIG. 1 is a diagram illustrating the circuit configuration of the radio-frequency module 1 and the communication device 6 according to the first embodiment. As illustrated in the drawing, the communication device 6 includes the radio-frequency module 1, a transmission amplifier 3T, a reception amplifier 31R, an RF signal processing circuit (RFIC) 4, and a baseband signal processing circuit (BBIC) 5.

The RFIC 4 is an RF signal processing circuit for processing radio-frequency signals transmitted and received by an antenna 2. Specifically, the RFIC 4 performs signal processing such as downconversion upon a radio-frequency reception signal inputted through a reception signal path in the radio-frequency module 1 and outputs a reception signal generated as a result of the signal processing to the BBIC 5. The RFIC 4 also performs signal processing such as upconversion upon a transmission signal inputted from the BBIC 5 and outputs a radio-frequency transmission signal generated as a result of the signal processing to a transmission signal path in the radio-frequency module 1.

The BBIC 5 is a circuit for performing signal processing using an intermediate frequency band lower than the frequency band of a radio-frequency signal passing through the radio-frequency module 1. A signal processed by the BBIC 5 is used as, for example, an image signal for image display or an audio signal for conversation through a speaker.

The RFIC 4 also functions as a control unit for performing connection switching of switches 11 and 12 in the radio-frequency module 1 and controlling the gains of the transmission amplifier 3T and the reception amplifier 31R on the basis of a communication band (frequency band) used. Specifically, the RFIC 4 performs connection switching of the switches 11 and 12 in the radio-frequency module 1 and adjusts the gains of the transmission amplifier 3T and the reception amplifier 31R in accordance with a control signal (not illustrated). The control unit may be disposed outside the RFIC 4, for example, in the radio-frequency module 1 or the BBIC 5.

The reception amplifier 31R preferentially amplifies a reception signal in a band A (second communication band) belonging to a first frequency band among reception signals outputted from the radio-frequency module 1 and outputs the amplified reception signal to the RFIC 4.

The transmission amplifier 3T preferentially amplifies a radio-frequency signal in a band B belonging to a second frequency band and outputs the amplified transmission signal to the radio-frequency module 1.

The reception amplifier 31R and the transmission amplifier 3T are formed of, for example, a CMOS (complementary metal oxide semiconductor), an FET (field-effect transistor) made from GaAs, or an HBT (hetero junction bipolar transistor).

The antenna 2 is connected to a transmission/reception terminal 110 of the radio-frequency module 1. The antenna 2 radiates a transmission signal outputted from the radio-frequency module 1 and outputs an externally received radio-frequency signal to the radio-frequency module 1. The antenna 2 may be included in the communication device 6 according to this embodiment. The BBIC 5 is not an essential constituent element in the communication device 6 according to this embodiment.

The transmission amplifier 3T and the reception amplifier 31R may be included in the radio-frequency module 1.

Next, the detailed configuration of the radio-frequency module 1 will be described.

As illustrated in FIG. 1, the radio-frequency module 1 includes the transmission/reception terminal 110, a reception terminal 120 (first reception terminal), a transmission terminal 130 (first transmission terminal), the switches 11 and 12, a reception filter 21R, a transmission filter 22T, a filter 23, a bypass path 61, a reception path 62, and a transmission path 63.

The switch 11 is a first switch that has a common terminal 11a (first common terminal) connected to the transmission/reception terminal 110, a selection terminal 11b (first selection terminal), and a selection terminal 11c (second selection terminal) and performs switching between the state in which the common terminal 11a and the selection terminal 11b are connected and the state in which the common terminal 11a and the selection terminal 11c are connected.

The reception filter 21R is a first reception filter that has a reception band in the band A belonging to the first frequency band as a passband and has an output terminal connected to the reception terminal 120.

The transmission filter 22T is a second transmission filter that has a transmission band in the band B belonging to the second frequency band different from the first frequency band as a passband and has an input terminal connected to the transmission terminal 130 and an output terminal connected to the selection terminal 11c.

The filter 23 is a third filter that has the transmission band in the band B belonging to the second frequency band as an attenuation band and is connected between the selection terminal 11c and the reception filter 21R.

The reception path 62 is a first reception path which connects the selection terminal 11c and the input terminal of the reception filter 21R and on which the filter 23 is disposed. In this embodiment, the reception path 62 connects the selection terminal 11c and the switch 12 connected to the input terminal of the reception filter 21R.

Examples of the reception filter 21R, the transmission filter 22T, and the filter 23 include a surface acoustic wave filter, an acoustic wave filter using bulk acoustic waves (BAWs), an LC resonator filter, and a dielectric filter, but the materials and structures of these filters are not limited.

The bypass path 61 is a first bypass path which connects the selection terminal 11b and the input terminal of the reception filter 21R and on which no filter is disposed. In this embodiment, the bypass path 61 connects the selection terminal 11b and the switch 12 connected to the input terminal of the reception filter 21R. That is, the selection terminal 11b and a selection terminal 12b are directly connected via a wiring line.

The transmission path 63 is a second transmission path which connects the selection terminal 11c and the transmission terminal 130 and on which the transmission filter 22T is disposed.

The switch 12 is a second switch that has a common terminal 12a (second common terminal) connected to the input terminal of the reception filter 21R, the selection terminal 12b (third selection terminal) connected to the bypass path 61, and a selection terminal 12c (fourth selection terminal) connected to the output terminal of the filter 23 and performs switching between the state in which the common terminal 12a and the selection terminal 12b are connected and the state in which the common terminal 12a and the selection terminal 12c are connected.

The switch 12 is not an essential constituent element in the radio-frequency module 1. That is, one end of the bypass path 61 and one end of the reception path 62 may be directly connected to the input terminal of the reception filter 21R.

Each of FIGS. 2A and 2B is a diagram describing a factor in the degradation of reception sensitivity of a multiplexer in which the transmission filter 22T and the reception filter 21R are connected in common to the transmission/reception terminal 110. FIG. 2A illustrates the circuit configuration of a multiplexer according to a comparative example including the transmission filter 22T and the reception filter 21R. FIG. 2B schematically illustrates the exemplary bandpass characteristics of the transmission filter 22T and the reception filter 21R.

It is apparent from FIG. 2B that, in the bandpass characteristics of a reception filter having a reception band (a band A-Rx) in the band A as a passband, a band in which an attenuation is small (attenuation characteristics degrade) is present on the higher-frequency side of the passband of the reception filter. The region where attenuation characteristics degrade may overlap the passband (a band B-Tx) of the transmission filter 22T. When a reception signal in the band A and a transmission signal in the band B are simultaneously received and transmitted in this frequency relationship, a part of the transmission signal in the band B that has passed from the transmission terminal 130 to the transmission filter 22T turns to the reception filter 21R and leaks into the reception terminal 120. As a result, the leaked transmission signal in the band B becomes noise in the RFIC connected to the reception terminal 120 and the reception sensitivity of the reception signal in the band A degrades.

In the radio-frequency module 1 according to this embodiment, even if the reception filter 21R has the attenuation characteristics illustrated in FIGS. 2A and 2B and the band in which an attenuation degrades and the passband of the transmission filter 22T overlap, the filter 23 attenuates the transmission of the transmission signal in the band B, which has inputted from the transmission terminal 130 and passed through the transmission filter 22T, to the reception path 62. The reason for this is that the filter 23 has the transmission band in the band B as an attenuation band, and the input terminal thereof and the output terminal of the transmission filter 22T are connected in common to the selection terminal 11c.

That is, the radio-frequency module 1 according to this embodiment can suppress the degradation of reception sensitivity in a system in which the transmission of a transmission signal and the reception of a reception signal can be simultaneously performed. When the transmission of a reception signal in the band A is performed and the transmission of a transmission signal in the band B is not performed, the reception signal can pass through the bypass path 61 without passing through the reception path 62. Accordingly, the reception signal in the band A can be transmitted with low loss without being degraded because of the insertion loss of the filter 23.

In this embodiment, the band A may be located on the higher-frequency side or lower-frequency side of the band B.

When the reception filter 21R is, for example, an acoustic wave filter, a band in which an attenuation is small (attenuation characteristics degrade) may be present on the higher-frequency side of the passband. This band may overlap the passband of the transmission filter 22T. That is, the case may occur where the bands A and B are in the frequency relationship illustrated in FIGS. 2A and 2B and the transmission band belonging to the second frequency band is located on the higher-frequency side of the reception band belonging to the first frequency band.

In this case, the degradation of the reception sensitivity of a reception signal in the band A can be suppressed depending on the location of the filter 23, and the bypass path 61 can transmit the reception signal in the band A with low loss. When the transmission band in the band B is located on the higher-frequency side of the reception band in the band A, the filter 23 may be a low-pass filter that has the transmission band in the band B as an attenuation band and the reception band in the band A as a passband. Alternatively, the filter 23 may be a notch filter that has the transmission band in the band B as an attenuation band and the other band as a passband.

In the radio-frequency module 1 and the communication device 6 according to this embodiment, as the band A belonging to the first frequency band, any one of bands belonging to Band1 (the reception band: 2110 to 2170 MHz), Band3 (the reception band: 1805 to 1880 MHz), Band5 (the reception band: 869 to 894 MHz), Band8 (the reception band: 925 to 960 MHz), Band11 (the reception band: 1475.9 to 1495.9 MHz), Band25 (the reception band: 1930 to 1995 MHz), Band26 (the reception band: 859 to 894 MHz), Band28 (the reception band: 758 to 803 MHz), Band34 (the band: 2010 to 2025 MHz), Band39 (the band: 1880 to 1920 MHz), Band40 (the band: 2300 to 2400 MHz), and 5G NR (5th generation new radio: 3300 to 5000 Hz) in LTE (long term evolution) may be employed. At that time, LTE Band41 (the band: 2496 to 2690 MHz) may be employed as the band B belonging to the second frequency band. Examples of a band belonging to 5G NR include Bandn78 (the band: 3300 to 3800 Hz) and Bandn79 (the band: 4400 to 5000 Hz).

Alternatively, as the band A belonging to the first frequency band, any one of bands belonging to Band1, Band5, Band1 (the reception band: 2620 to 2690 MHz), Band8, Band20 (the reception band: 791 to 821 MHz), Band28, Band38 (the band: 2570 to 2620 MHz), Band39, and 5G NR in LTE may be employed. At that time, LTE Band40 may be employed as the band B belonging to the second frequency band.

[1.2 Circuit State of the Radio-Frequency Module 1 in Response to Switching Operation of Switch]

FIG. 3A is a diagram illustrating a circuit state when a reception signal in the band A is transmitted in the radio-frequency module 1 and the communication device 6 according to the first embodiment. As illustrated in the drawing, when a reception signal in the band A is transmitted and a transmission signal in the band B is not transmitted, the common terminal 11a and the selection terminal 11b are connected and the common terminal 11a and the selection terminal 11c are not connected in the switch 11. In the switch 12, the common terminal 12a and the selection terminal 12b are connected and the common terminal 12a and the selection terminal 12c are not connected.

The reception signal in the band A is therefore outputted from the reception terminal 120 to the reception amplifier 31R via the transmission/reception terminal 110, the common terminal 11a, the selection terminal 11b, the bypass path 61, the selection terminal 12b, the common terminal 12a, and the reception filter 21R.

When a reception signal in the band A is transmitted and a transmission signal in the band B is not transmitted, the reception signal in the band A does not need to pass through the filter 23 because there is no interference between the reception signal in the band A and a transmission signal in the band B with the above connection configuration. Since the reception signal in the band A therefore passes through the bypass path 61, the reception signal in the band A can be transmitted with low loss without being degraded because of the insertion loss of the filter 23.

FIG. 3B is a diagram illustrating a circuit state when a reception signal in the band A and a transmission signal in the band B are simultaneously transmitted in the radio-frequency module 1 and the communication device 6 according to the first embodiment. As illustrated in the drawing, when a reception signal in the band A and a transmission signal in the band B are simultaneously transmitted, the common terminal 11a and the selection terminal 11c are connected and the common terminal 11a and the selection terminal 11b are not connected in the switch 11. In the switch 12, the common terminal 12a and the selection terminal 12c are connected and the common terminal 12a and the selection terminal 12b are not connected.

The reception signal in the band A is therefore outputted from the reception terminal 120 to the reception amplifier 31R via the transmission/reception terminal 110, the common terminal 11a, the selection terminal 11c, the filter 23 (the reception path 62), the selection terminal 12c, the common terminal 12a, and the reception filter 21R. The transmission signal in the band B is outputted from the transmission/reception terminal 110 to the antenna 2 via the transmission amplifier 3T, the transmission terminal 130, the transmission filter 22T (the transmission path 63), the selection terminal 11c, and the common terminal 11a.

Since the transmission signal in the band B inputted from the transmission terminal 130 is prevented from transmitting to the reception path 62 as much as possible by the filter 23 after passing through the transmission filter 22T with the above connection configuration, the transmission signal in the band B is transmitted to the transmission/reception terminal 110 via the switch 11 with low loss. Since the reception signal in the band A passes through the reception filter 21R in a state where the transmission of the transmission signal in the band B to the reception filter 21R has been prevented as much as possible, the degradation of the reception sensitivity of the reception signal in the band A can be suppressed.

The radio-frequency module 1 according to this embodiment can transmit a reception signal in the band A with low loss when the transmission of a reception signal in the band A is performed and the transmission of a transmission signal in the band B is not performed, and can suppress the degradation of the reception sensitivity of a reception signal in the band A when the transmission of a transmission signal in the band B and the reception of a reception signal in the band A are simultaneously performed.

In the radio-frequency module 1 according to this embodiment, the reception filter 21R has a reception band in the band A belonging to the first frequency band as a passband and the transmission filter 22T has a transmission band in the band B belonging to the second frequency band different from the first frequency band as a passband. However, the first frequency band and the second frequency band may be the same frequency band. Each of the first frequency band and the second frequency band is defined as, for example, a frequency band group including a plurality of communication bands of adjacent frequencies.

The band A and the band B may be the same communication band. In this case, the reception filter 21R and the transmission filter 22T function as a duplexer that transmits and receives radio-frequency signals in a single communication band. It should be noted that the radio-frequency module 1 according to this embodiment does not have the configuration of a duplexer in the related art in which the input terminal of the reception filter 21R and the output terminal of the transmission filter 22T are connected in common but the configuration in which the filter 23 connected to the preceding stage of the reception filter 21R and the transmission filter 22T are connected in common (to the selection terminal 11c).

In the radio-frequency module 1 and the communication device 6 according to this embodiment, the gain of the reception amplifier 31R at the time of amplification of a reception signal that has transmitted through the reception path 62 may be higher than that at the time of amplification of a reception signal that has transmitted through the bypass path 61.

When a reception signal in the band A transmits through the reception path 62, the intensity of the reception signal in the band A inputted into the reception amplifier 31R becomes lower than that when a reception signal in the band A transmits through the bypass path 61 by the insertion loss of the filter 23 because the reception signal passes through the filter 23. By adjusting the gain of the reception amplifier 31R as above, the intensity of a reception signal in the band A when it transmits through the reception path 62 (the transmission of a reception signal in the band A and the transmission of a transmission signal in the band B are simultaneously performed) and the intensity of a reception signal in the band A when it transmits through the bypass path 61 (the transmission of a reception signal in the band A is performed and the transmission of a transmission signal in the band B is not performed) can be matched at the output stage of the reception amplifier 31R.

A control unit included in the RFIC 4, the BBIC 5, or the radio-frequency module 1 controls the gain of the reception amplifier 31R on the basis of the information about the simultaneous transmission of signals in the bands A and B or the transmission of a single signal.

[1.3 Configuration of Radio-Frequency Module 1A and Communication Device 6A according to Modification]

FIG. 4 is a diagram illustrating the circuit configuration of the radio-frequency module 1A and the communication device 6A according to a modification of the first embodiment. As illustrated in the drawing, the communication device 6A includes the radio-frequency module 1A and the RFIC 4. In this modification, the reception amplifier 31R and the transmission amplifier 3T are included in the radio-frequency module 1A.

As illustrated in FIG. 4, the radio-frequency module 1A includes the transmission/reception terminal 110, the reception terminal 120 (the first reception terminal), the transmission terminal 130 (the first transmission terminal), the switches 11 and 12, switches 13 and 14, the reception filter 21R, the transmission filter 22T, the filter 23, the reception amplifier 31R, the transmission amplifier 3T, a phase shifter 41, the bypass path 61, a bypass path 71, the reception path 62, a reception path 72, and the transmission path 63.

The radio-frequency module 1A according to this modification differs from the radio-frequency module 1 according to the first embodiment in that the reception amplifier 31R, the transmission amplifier 3T, the switches 13 and 14, the phase shifter 41, the bypass path 71, and the reception path 72 are added. The descriptions of the same points in the radio-frequency module 1A according to this modification as the radio-frequency module 1 according to the first embodiment will be omitted, and different points will be mainly described.

Since the reception amplifier 31R and the transmission amplifier 3T are the same as the reception amplifier 31R and the transmission amplifier 3T in the communication device 6 according to the first embodiment, respectively, the description thereof will be omitted.

The switch 13 is a third switch that has a common terminal 13a (fourth common terminal) indirectly connected to the reception terminal 120 via the reception amplifier 31R, a selection terminal 13b (fifth selection terminal), and a selection terminal 13c (sixth selection terminal) and performs switching between the state in which the common terminal 13a and the selection terminal 13b are connected and the state in which the common terminal 13a and the selection terminal 13c are connected.

The phase shifter 41 changes the phase of a radio-frequency signal.

The switch 14 has a common terminal 14a connected to the RFIC 4 and selection terminals 14b and 14c and performs switching between the state in which the common terminal 14a and the selection terminal 14b are connected and the state in which the common terminal 14a and the selection terminal 14c are connected. The common terminal 14a functions as a third reception terminal disposed on the output side of the reception terminal 120.

The reception path 72 is a second reception path which connects the selection terminal 13c and the common terminal 14a (via the selection terminal 14c) and on which the phase shifter 41 is disposed.

The bypass path 71 is a second bypass path which connects the selection terminal 13b and the common terminal 14a (via the selection terminal 14b) and on which the phase shifter 41 is not disposed. That is, the selection terminals 13b and 14b are directly connected via a wiring line.

The switch 14 is not an essential element in the radio-frequency module 1A. That is, one end of the bypass path 71 and one end of the reception path 72 may be directly connected to the RFIC 4.

For example, when a reception signal in the band A transmits through the bypass path 61, the reception signal in the band A passes through the reception path 72 on which the phase shifter 41 is disposed by connecting the common terminal 13a and the selection terminal 13c and connecting the common terminal 14a and the selection terminal 14c with the above configuration. On the other hand, when a reception signal in the band A transmits through the reception path 62, the reception signal in the band A passes through the bypass path 71 on which the phase shifter 41 is not disposed by connecting the common terminal 13a and the selection terminal 13b and connecting the common terminal 14a and the selection terminal 14b.

When a reception signal in the band A transmits through the bypass path 61, the reception signal in the band A passes through the bypass path 71 on which the phase shifter 41 is not disposed by connecting the common terminal 13a and the selection terminal 13b and connecting the common terminal 14a and the selection terminal 14b. On the other hand, when a reception signal in the band A transmits through the reception path 62, the reception signal in the band A passes through the reception path 72 on which the phase shifter 41 is disposed by connecting the common terminal 13a and the selection terminal 13c and connecting the common terminal 14a and the selection terminal 14c.

Accordingly, even in the state where a reception signal in the band A has different phases at the reception terminal 120 after passing through the bypass path 61 and the reception path 62, the phases of signals that have passed through the bypass path 61 and the reception path 62 can be matched by causing the reception signal that has passed through the bypass path 61 to pass (or not pass) through the phase shifter 41.

In the radio-frequency module 1A according to this modification, the gain of the reception amplifier 31R at the time of amplification of a reception signal that has transmitted through the reception path 62 can be made higher than that at the time of amplification of a reception signal that has transmitted through the bypass path 61. That is, the above gain control of the reception amplifier 31R and the above phase control of the phase shifter 41 may be performed in synchronization with each other.

Second Embodiment

In this embodiment, a radio-frequency module and a communication device will be described which can suppress the reception sensitivity of respective reception signals in a plurality of communication bands in a system capable of switching between the reception signals and transmitting the reception signal.

[2.1 Configuration of Radio-Frequency Module 1B and Communication Device 6B]

FIG. 5 is a diagram illustrating the circuit configuration of the radio-frequency module 1B and the communication device 6B according to the second embodiment. As illustrated in the drawing, the communication device 6B includes the radio-frequency module 1B, the transmission amplifier 3T, a reception amplification circuit 3R, the RFIC 4, and the BBIC 5.

The reception amplification circuit 3R includes the reception amplifier 31R and a reception amplifier 32R. The reception amplifier 31R preferentially amplifies a reception signal in the band A (the second communication band) among reception signals outputted from the reception terminal 120 of the radio-frequency module 1 and outputs the amplified reception signal to the RFIC 4. The reception amplifier 32R preferentially amplifies a reception signal in a band C (first communication band) among reception signals outputted from a reception terminal 140 of the radio-frequency module 1 and outputs the amplified reception signal to the RFIC 4.

The transmission amplifier 3T preferentially amplifies a radio-frequency signal in the band B belonging to the second frequency band and outputs the amplified transmission signal to the radio-frequency module 1.

Since the RFIC 4 and the BBIC 5 have the same functions as the RFIC 4 and the BBIC 5 in the communication device 6 according to the first embodiment, respectively, the description thereof will be omitted.

As illustrated in FIG. 5, the radio-frequency module 1B includes the transmission/reception terminal 110, the reception terminal 120 (the first reception terminal), the reception terminal 140 (a second reception terminal), the transmission terminal 130 (the first transmission terminal), the switch 11, a switch 15, the reception filter 21R, a reception filter 24R, the transmission filter 22T, a filter 25, the bypass path 61, the reception path 62, and the transmission path 63.

The radio-frequency module 1B differs from the radio-frequency module 1 according to the first embodiment in the addition of the reception terminal 140 and the reception filter 24R and the configuration of the switch 15. The description of the same points in the radio-frequency module 1B according to this embodiment as the radio-frequency module 1 according to the first embodiment will be omitted, and different points will be mainly described.

The switch 15 is a second switch that has a common terminal 15a (the second common terminal) connected to the input terminal of the reception filter 21R, a selection terminal 15c (the third selection terminal) connected to the bypass path 61, and a selection terminal 15d (the fourth selection terminal) connected to the output terminal of the filter 25 and performs switching between the state in which the common terminal 15a and the selection terminal 15c are connected and the state in which the common terminal 15a and the selection terminal 15d are connected. The switch 15 further has a common terminal 15b (a third common terminal) and performs switching between the state in which the common terminal 15b and the selection terminal 15c are connected and the state in which the common terminal 15b and the selection terminal 15d are connected.

The reception filter 24R is a fourth reception filter that has a reception band in the band C (the first communication band) as a passband and has an input terminal connected to the common terminal 15b and an output terminal connected to the reception terminal 140.

The reception filter 21R has a reception band in the band A (the second communication band) belonging to the first frequency band as a passband.

The bands A and C may be included in the same first frequency band or different frequency bands.

The filter 25 is a filter that has a transmission band in the band B belonging to the second frequency band as an attenuation band and a band including the reception bands in the bands A and B as a passband.

Even if a band in which an attenuation is degraded and the passband of the transmission filter 22T overlap in the bandpass characteristics of the reception filters 21R and 24R, the filter 25 attenuates the transmission of the transmission signal in the band B, which has inputted from the transmission terminal 130 and passed through the transmission filter 22T, to the reception path 62 with the above configuration. The reason for this is that the filter 25 has the transmission band in the band B as an attenuation band, and the input terminal of the filter 25 and the output terminal of the transmission filter 22T are connected in common to the selection terminal 11c. Since the filter 25 has the band including the bands A and B as a passband, it can pass both reception signals in the bands A and B with low loss. The switch 15 switches between the transmission of a reception signal in the band A and the transmission of a reception signal in the band B.

That is, the radio-frequency module 1B according to this embodiment can suppress the reception sensitivity of both reception signals in the bands A and C in a system capable of simultaneously performing the transmission of a transmission signal and the reception of at least one of reception signals in different communication bands. When at least one of reception signals in the bands A and C is transmitted and a transmission signal in the band B is not transmitted, the reception signal can pass through the bypass path 61 without passing through the reception path 62. Accordingly, the reception signals in the bands A and C can be transmitted with low loss without being degraded because of the insertion loss of the filter 25.

In the radio-frequency module 1B and the communication device 6B according to this embodiment, as the band A, any one of bands belonging to Band1, Band3, Band5, Band8, Band11, Band25, Band26, Band28, Band34, Band39, Band40, and 5G NR in LTE may be employed. As the band C, any one of bands belonging to Band1, Band3, Band5, Band8, Band11, Band25, Band26, Band28, Band34, Band39, Band40, and 5G NR in LTE may be employed. At that time, LTE Band41 may be employed as the band B.

Alternatively, as the band A, any one of bands belonging to Band1, Band5, Band7, Band8, Band20, Band28, Band38, Band39, and 5G NR in LTE may be employed. As the band C, any one of bands belonging to Band1, Band5, Band7, Band8, Band20, Band28, Band38, Band39, and 5G NR in LTE may be employed. At that time, LTE Band40 may be employed as the band B.

[2.2 Circuit State of the Radio-Frequency Module 1B in Response to Switching Operation of Switch]

FIG. 6A is a diagram illustrating a circuit state when a reception signal in the band C is transmitted in the radio-frequency module 1B and the communication device 6B according to the second embodiment. As illustrated in the drawing, when a reception signal in the band C is transmitted and a transmission signal in the band B is not transmitted (one downlink), the common terminal 11a and the selection terminal 11b are connected and the common terminal 11a and the selection terminal 11c are not connected in the switch 11. In the switch 15, the common terminal 15b and the selection terminal 15c are connected and the common terminal 15b and the selection terminal 15d are not connected.

Accordingly, the reception signal in the band C is outputted from the reception terminal 140 to the reception amplifier 32R via the transmission/reception terminal 110, the common terminal 11a, the selection terminal 11b, the bypass path 61, the selection terminal 15c, the common terminal 15b, and the reception filter 24R.

When a reception signal in the band C is transmitted and a transmission signal in the band B is not transmitted, the reception signal in the band C does not need to pass through the filter 25 because there is no interference between the reception signal in the band C and a transmission signal in the band B with the above connection configuration. Since the reception signal in the band C therefore passes through the bypass path 61, the reception signal in the band C can be transmitted with low loss without being degraded because of the insertion loss of the filter 25.

Although not illustrated, when a reception signal in the band A is transmitted and a transmission signal in the band B is not transmitted (one downlink), the common terminal 11a and the selection terminal 11b are connected and the common terminal 11a and the selection terminal 11c are not connected in the switch 11. In the switch 15, the common terminal 15a and the selection terminal 15c are connected and the common terminal 15a and the selection terminal 15d are not connected.

Accordingly, the reception signal in the band A is outputted from the reception terminal 120 to the reception amplifier 31R via the transmission/reception terminal 110, the common terminal 11a, the selection terminal 11b, the bypass path 61, the selection terminal 15c, the common terminal 15a, and the reception filter 21R.

When a reception signal in the band A is transmitted and a transmission signal in the band B is not transmitted, the reception signal in the band A does not need to pass through the filter 25 because there is no interference with the reception signal in the band A and a transmission signal in the band B with the above connection configuration. Since the reception signal in the band A therefore passes through the bypass path 61, the reception signal in the band A can be transmitted with low loss without being degraded because of the insertion loss of the filter 25.

Furthermore, although not illustrated, when reception signals in the bands A and C are simultaneously transmitted and a transmission signal in the band B is not transmitted, the common terminal 11a and the selection terminal 11b are connected and the common terminal 11a and the selection terminal 11c are not connected in the switch 11. In the switch 15, the common terminal 15a and the selection terminal 15c are connected, the common terminal 15b and the selection terminal 15c are connected, the common terminal 15a and the selection terminal 15d are not connected, and the common terminal 15b and the selection terminal 15d are not connected. The switch 15 forms a multi-connection switch circuit capable of simultaneously establishing the connection between the common terminal 15a and the selection terminal 15c and the connection between the common terminal 15b and the selection terminal 15c.

Accordingly, the reception signal in the band A is outputted from the reception terminal 120 to the reception amplifier 31R via the transmission/reception terminal 110, the common terminal 11a, the selection terminal 11b, the bypass path 61, the selection terminal 15c, the common terminal 15a, and the reception filter 21R. At the same time, the reception signal in the band C is outputted from the reception terminal 140 to the reception amplifier 32R via the transmission/reception terminal 110, the common terminal 11a, the selection terminal 11b, the bypass path 61, the selection terminal 15c, the common terminal 15b, and the reception filter 24R.

When reception signals in the bands A and C are transmitted and a transmission signal in the band B is not transmitted (two downlinks), the reception signals in the bands A and C do not need to pass through the filter 25 because there is no interference between each of the reception signals in the bands A and C and a transmission signal in the band B with the above connection configuration. Since the reception signals in the bands A and C therefore pass through the bypass path 61, the reception signals in the bands A and C can be transmitted with low loss without being degraded because of the insertion loss of the filter 25.

FIG. 6B is a diagram illustrating a circuit state when a reception signal in the band C and a transmission signal in the band B are simultaneously transmitted in the radio-frequency module 1B and the communication device 6B according to the second embodiment. As illustrated in the drawing, when a reception signal in the band C and a transmission signal in the band B are simultaneously transmitted (one uplink, one downlink), the common terminal 11a and the selection terminal 11c are connected and the common terminal 11a and the selection terminal 11b are not connected in the switch 11. In the switch 15, the common terminal 15b and the selection terminal 15d are connected and the common terminal 15b and the selection terminal 15c are not connected.

Accordingly, the reception signal in the band C is outputted from the reception terminal 140 to the reception amplifier 32R via the transmission/reception terminal 110, the common terminal 11a, the selection terminal 11c, the filter 25 (the reception path 62), the selection terminal 15d, the common terminal 15b, and the reception filter 24R. The transmission signal in the band B is outputted from the transmission/reception terminal 110 to the antenna 2 via the transmission amplifier 3T, the transmission terminal 130, the transmission filter 22T (the transmission path 63), the selection terminal 11c, and the common terminal 11a.

Since the transmission signal in the band B inputted from the transmission terminal 130 is prevented from transmitting to the reception path 62 by the filter 25 after passing through the transmission filter 22T with the above connection configuration, the transmission signal in the band B is transmitted to the transmission/reception terminal 110 via the switch 11 with low loss. The reception signal passes through the reception filter 24R in a state where the transmission of the transmission signal in the band B to the reception filter 24R has been prevented as much as possible. That is, the degradation of reception sensitivity can be suppressed when the transmission of a transmission signal in the band B and the reception of a reception signal in the band C are simultaneously performed.

Although not illustrated, when a reception signal in the band A and a transmission signal in the band B are simultaneously transmitted (one uplink, one downlink), the common terminal 11a and the selection terminal 11c are connected and the common terminal 11a and the selection terminal 11b are not connected in the switch 11. In the switch 15, the common terminal 15a and the selection terminal 15d are connected and the common terminal 15a and the selection terminal 15c are not connected.

Accordingly, the reception signal in the band A is outputted from the reception terminal 120 to the reception amplifier 31R via the transmission/reception terminal 110, the common terminal 11a, the selection terminal 11c, the filter 25 (the reception path 62), the selection terminal 15d, the common terminal 15a, and the reception filter 21R. The transmission signal in the band B is outputted from the transmission/reception terminal 110 to the antenna 2 via the transmission amplifier 3T, the transmission terminal 130, the transmission filter 22T (the transmission path 63), the selection terminal 11c, and the common terminal 11a.

Since the transmission signal in the band B inputted from the transmission terminal 130 is prevented from transmitting to the reception path 62 by the filter 25 after passing through the transmission filter 22T with the above connection configuration, the transmission signal in the band B is transmitted to the transmission/reception terminal 110 via the switch 11 with low loss. The reception signal passes through the reception filter 21R in a state where the transmission of the transmission signal in the band B to the reception filter 21R has been prevented as much as possible. That is, the degradation of reception sensitivity can be suppressed when the transmission of a transmission signal in the band B and the reception of a reception signal in the band A are simultaneously performed.

Although not illustrated, when reception signals in the band A and C and a transmission signal in the band B are simultaneously transmitted (one uplink, two downlinks), the common terminal 11a and the selection terminal 11c are connected and the common terminal 11a and the selection terminal 11b are not connected in the switch 11. In the switch 15, the common terminal 15a and the selection terminal 15d are connected, the common terminal 15b and the selection terminal 15d are connected, the common terminal 15a and the selection terminal 15c are not connected, and the common terminal 15b and the selection terminal 15c are not connected.

Accordingly, the reception signal in the band A is outputted from the reception terminal 120 to the reception amplifier 31R via the transmission/reception terminal 110, the common terminal 11a, the selection terminal 11c, the filter 25 (the reception path 62), the selection terminal 15d, the common terminal 15a, and the reception filter 21R. The reception signal in the band C is outputted from the reception terminal 140 to the reception amplifier 32R via the transmission/reception terminal 110, the common terminal 11a, the selection terminal 11c, the filter 25 (the reception path 62) the selection terminal 15d, the common terminal 15b, and the reception filter 24R. The transmission signal in the band B is outputted from the transmission/reception terminal 110 to the antenna 2 via the transmission amplifier 3T, the transmission terminal 130, the transmission filter 22T (the transmission path 63), the selection terminal 11c, and the common terminal 11a.

Since the transmission signal in the band B inputted from the transmission terminal 130 is prevented from transmitting to the reception path 62 by the filter 25 after passing through the transmission filter 22T with the above connection configuration, the transmission signal in the band B is transmitted to the transmission/reception terminal 110 via the switch 11 with low loss. The reception signal in the band A passes through the reception filter 21R and the reception signal in the band C passes through the reception filter 24R in a state where the transmission of the transmission signal in the band B to the reception filters 21R and 24R has been prevented as much as possible. That is, when the transmission of a transmission signal in the band B and the reception of reception signals in the band A and C are simultaneously performed, the degradation of reception sensitivity of both the reception signals in the bands A and C can be suppressed.

The radio-frequency module 1B and the communication device 6B according to this embodiment may have the configuration in which the gain control of the reception amplifier and the phase control of the phase shifter described in the first embodiment are performed.

Other Embodiments

A radio-frequency module and a communication device according to the present disclosure have been described with reference to the first and second embodiments, but are not limited to the above embodiments. The present disclosure also includes other embodiments realized by combining optional constituents of the above embodiments, modifications obtained by making various changes, which are conceived by those skilled in the art, to above embodiments without departing from the spirit and scope of the present disclosure, and various apparatuses including a radio-frequency module and a communication device according to the present disclosure.

A radio-frequency module and a communication device according to the first and second embodiments are applied to, for example, a communication system compliant with 3GPP (the third generation partnership project) standard. The bands A, B, and C described in the first and second embodiments are applied to, for example, respective LTE or NR bands.

Although the configuration has been exemplified in the above embodiments in which two different communication bands can be simultaneously used, the configuration of a radio-frequency module and a communication device according to the present disclosure can also be applied to a configuration in which three or more different communication bands can be simultaneously used. That is, the present disclosure also includes a radio-frequency module or a communication device having a configuration in which three or more different communication bands can be simultaneously used and which includes the configuration of a radio-frequency module or a communication device according to the above embodiments and the modifications of the above embodiments.

Furthermore, for example, in a radio-frequency module and a communication device according to the above embodiments and the modifications of the embodiments, other radio-frequency circuit elements and other wiring lines may be inserted between the illustrated circuit elements and between the illustrated paths each connecting signal paths.

In a radio-frequency module and a communication device according to the above embodiments and the modifications of the embodiments, the expression of "A and B are connected" represents not only the direct connection between A and B via no radio-frequency circuit element but also the indirect connection between A and B via a passive circuit formed of an inductor and a capacitor or a switching circuit.

There is a case where the transmission/reception terminal 110, the reception terminal 120, and the transmission terminal 130 are not placed on a wiring line connecting two elements. In this case, for example, the transmission/reception terminal 110 corresponds to the common terminal 11a of the switch 11, the reception terminal 120 corresponds to the output terminal of the reception filter 21R or the input terminal of the reception amplifier 31R, and the transmission terminal 130 corresponds to the input terminal of the transmission filter 22T or the output terminal of the transmission amplifier 3T in the radio-frequency module 1.

In the above embodiments, "a path connecting A and B" is defined as a path between A and B placed on a path passing through A and B. This path is, for example, a wiring line and includes a circuit element placed in the middle of the wiring line.

The present disclosure is widely applicable to communication devices, such as cellular phones, as a multi-band/multi-mode front-end module capable of simultaneously transmitting radio-frequency signals in different communication bands.

1, 1A, and 1B radio-frequency module
2 antenna
3R reception amplification circuit
3T transmission amplifier
4 RF signal processing circuit (RFIC)
5 baseband signal processing circuit (BBIC)
6, 6A, and 6B communication device
11, 12, 13, 14, and 15 switch
11a. 12a. 13a. 14a. 15a, and 15b common terminal
11b. 11c. 12b. 12c. 13b. 13c. 14b. 14c. 15c, and 15d selection terminal
21R and 24R reception filter
22T transmission filter
23 and 25 filter
31R and 32R reception amplifier
41 phase shifter
61 and 71 bypass path
62 and 72 reception path
63 transmission path
110 transmission/reception terminal
120 and 140 reception terminal
130 transmission terminal

The invention claimed is:
1. A radio-frequency module comprising:
a transmission/reception terminal;
a first reception terminal;
a first transmission terminal;
a first switch that has a first selection terminal, a second selection terminal, and a first common terminal connected to the transmission/reception terminal, the first switch configured to selectively connect the first common terminal to the first selection terminal and the first common terminal to the second selection terminal;

a first reception filter that has a reception band belonging to a first frequency band as a passband and an output terminal connected to the first reception terminal;

a second transmission filter that has a transmission band belonging to a second frequency band as a passband, an input terminal connected to the first transmission terminal and an output terminal connected to the second selection terminal;

a third filter that has the transmission band as an attenuation band and is connected between the second selection terminal and the first reception filter;

a first reception path which connects the second selection terminal and an input terminal of the first reception filter and on which the third filter is disposed;

a first bypass path which connects the first selection terminal and the input terminal of the first reception filter and on which no filter is disposed; and a second transmission path which connects the second selection terminal and the first transmission terminal and on which the second transmission filter is disposed, wherein the first selection terminal and the first reception filter are directly connected.

2. The radio-frequency module according to claim 1, wherein, when a reception signal in the first frequency band and a transmission signal in the second frequency band are simultaneously transmitted, the first common terminal and the second selection terminal are connected and the first common terminal and the first selection terminal are not connected, and wherein, when a reception signal in the first frequency band is transmitted and a transmission signal in the second frequency band is not transmitted, the first common terminal and the first selection terminal are connected and the first common terminal and the second selection terminal are not connected.

3. The radio-frequency module according to claim 2, wherein a frequency range of the first frequency band and a frequency range of the second frequency band differ from each other.

4. The radio-frequency module according to claim 2, wherein the reception band belonging to the first frequency band is any one of bands belonging to Band1, Band3, Band5, Band7, Band8, Band11, Band20, Band25, Band26, Band28, Band34, Band38, Band39, Band40, and 5G NR (5th generation new radio) in LTE (long-term evolution), and wherein the transmission band belonging to the second frequency band is any one of bands belonging to Band40 and Band41 in LTE.

5. The radio-frequency module according to claim 2, further comprising a reception amplifier that is connected to the first reception terminal and amplifies a radio-frequency signal transmitted through the first reception path or the first bypass path, and wherein a gain of the reception amplifier at a time of amplification of the radio-frequency signal transmitted through the first reception path is higher than the radio-frequency signal at a time of amplification of the radio-frequency signal transmitted through the first bypass path.

6. The radio-frequency module according to claim 2, further comprising:

a third reception terminal placed on an output side of the first reception terminal;

a phase shifter that changes a phase of a radio-frequency signal;

a third switch that has a fourth common terminal connected to the first reception terminal, a fifth selection terminal, and a sixth selection terminal, wherein the third switch selectively connects the fourth common terminal to the fifth selection terminal, to the fourth common terminal and to the sixth selection terminal;

a second reception path which connects the sixth selection terminal and the third reception terminal and on which the phase shifter is disposed; and a second bypass path which connects the fifth selection terminal and the third reception terminal and on which no phase shifter is disposed.

7. A communication device comprising:

the radio-frequency module according to claim 2; and an RF signal processing circuit that processes radio-frequency signals transmitted from the radio-frequency module and radio-frequency signals received by the radio-frequency module.

8. The radio-frequency module according to claim 2, further comprising:

a phase shifter that changes a phase of a radio-frequency signal;

a third switch that has a fourth common terminal connected to the first reception terminal, a fifth selection terminal, and a sixth selection terminal, wherein the third switch selectively connects the fourth common terminal to the fifth selection terminal, to the fourth common terminal and to the sixth selection terminal;

a second reception path which is connected to the sixth selection terminal and on which the phase shifter is disposed; and a second bypass path which is connected to the fifth selection terminal and on which no phase shifter is disposed.

9. The radio-frequency module according to claim 8, wherein one end of the second reception path is directly connected to an RF signal processing circuit.

10. The radio-frequency module according to claim 8, wherein one end of the second bypass path is directly connected to an RF signal processing circuit.

11. The radio-frequency module according to claim 1, wherein a frequency range of the first frequency band and a frequency range of the second frequency band differ from each other.

12. The radio-frequency module according to claim 11, wherein the transmission band belonging to the second frequency band is located on a higher-frequency side of the reception band belonging to the first frequency band.

13. The radio-frequency module according to claim 11, wherein the reception band belonging to the first frequency band is any one of bands belonging to Band1, Band3, Band5, Band7, Band8, Band11, Band20, Band25, Band26, Band28, Band34, Band38, Band39, Band40, and 5G NR (5th generation new radio) in LTE (long-term evolution), and wherein the transmission band belonging to the second frequency band is any one of bands belonging to Band40 and Band41 in LTE.

14. The radio-frequency module according to claim 1, wherein the reception band belonging to the first frequency band is any one of bands belonging to Band1, Band3, Band5, Band7, Band8, Band11, Band20, Band25, Band26, Band28, Band34, Band38, Band39, Band40, and 5G NR (5th generation new radio) in LTE (long-term evolution), and wherein the transmission band belonging to the second frequency band is any one of bands belonging to Band40 and Band41 in LTE.

15. The radio-frequency module according to claim 1, further comprising a reception amplifier that is connected to the first reception terminal and amplifies a radio-frequency signal transmitted through the first reception path or the first bypass path, and
  wherein a gain of the reception amplifier at a time of amplification of the radio-frequency signal transmitted through the first reception path is higher than the radio-frequency signal at a time of amplification of the radio-frequency signal transmitted through the first bypass path.

16. The radio-frequency module according to claim 1, further comprising:
  a third reception terminal placed on an output side of the first reception terminal;
  a phase shifter that changes a phase of a radio-frequency signal;
  a third switch that has a fourth common terminal connected to the first reception terminal, a fifth selection terminal, and a sixth selection terminal, wherein the third switch selectively connects the fourth common terminal to the fifth selection terminal, to the fourth common terminal and to the sixth selection terminal;
  a second reception path which connects the sixth selection terminal and the third reception terminal and on which the phase shifter is disposed; and
  a second bypass path which connects the fifth selection terminal and the third reception terminal and on which no phase shifter is disposed.

17. A communication device comprising:
  the radio-frequency module according to claim 1; and
  an RF signal processing circuit that processes radio-frequency signals transmitted from the radio-frequency module and radio-frequency signals received by the radio-frequency module.

18. The radio-frequency module according to claim 1, further comprising:
  a phase shifter that changes a phase of a radio-frequency signal;
  a third switch that has a fourth common terminal connected to the first reception terminal, a fifth selection terminal, and a sixth selection terminal, wherein the third switch selectively connects the fourth common terminal to the fifth selection terminal, to the fourth common terminal and to the sixth selection terminal;
  a second reception path which is connected to the sixth selection terminal and on which the phase shifter is disposed; and
  a second bypass path which is connected to the fifth selection terminal and on which no phase shifter is disposed.

19. The radio-frequency module according to claim 18, wherein one end of the second reception path is directly connected to an RF signal processing circuit.

20. The radio-frequency module according to claim 18, wherein one end of the second bypass path is directly connected to an RF signal processing circuit.

* * * * *

UNITED STATES PATENT AND TRADEMARK OFFICE
CERTIFICATE OF CORRECTION

PATENT NO. : 11,483,019 B2
APPLICATION NO. : 17/351867
DATED : October 25, 2022
INVENTOR(S) : Motoji Tsuda et al.

It is certified that error appears in the above-identified patent and that said Letters Patent is hereby corrected as shown below:

In the Specification

Column 6, Line 40, "Band1" should be -- Band7 --.

Signed and Sealed this
Fourth Day of July, 2023

Katherine Kelly Vidal
*Director of the United States Patent and Trademark Office*